(12) United States Patent
Kind

(10) Patent No.: US 8,505,614 B2
(45) Date of Patent: Aug. 13, 2013

(54) DEVICE FOR MINIMIZING AN UNDESIRED PASSAGE OF FLUID FROM A FIRST SECTOR TO A SECOND SECTOR AS WELL AS A HEAT EXCHANGER SYSTEM COMPRISING SUCH A DEVICE

(75) Inventor: Michael Kind, Berlin (DE)

(73) Assignee: Amrona AG (CH)

( * ) Notice: Subject to any disclaimer, the term of this patent is extended or adjusted under 35 U.S.C. 154(b) by 767 days.

(21) Appl. No.: 12/473,986

(22) Filed: May 28, 2009

(65) Prior Publication Data

US 2009/0294116 A1 Dec. 3, 2009

(30) Foreign Application Priority Data

May 30, 2008 (EP) .................................... 08104192

(51) Int. Cl.
- *F28D 17/00* (2006.01)
- *F28D 1/02* (2006.01)
- *F24D 5/10* (2006.01)
- *F24D 3/16* (2006.01)
- *F24H 3/02* (2006.01)
- *F24F 11/00* (2006.01)

(52) U.S. Cl.
USPC ........ 165/53; 165/4; 165/54; 165/56; 165/57; 454/238; 454/239

(58) Field of Classification Search
USPC ................... 165/53–57, 246, 4–10; 454/187, 454/237–239
See application file for complete search history.

(56) References Cited

U.S. PATENT DOCUMENTS

| | | | | |
|---|---|---|---|---|
| 4,264,244 A | * | 4/1981 | Steele | 406/182 |
| 2006/0090469 A1 | * | 5/2006 | Counterman | 60/660 |
| 2006/0278364 A1 | * | 12/2006 | Struensee | 165/9 |

FOREIGN PATENT DOCUMENTS

| | | |
|---|---|---|
| DE | 2725190 A1 | 12/1977 |
| DE | 10327078 A1 | 12/2004 |
| EP | 1777478 A | 4/2007 |
| JP | 02-083787 U | 6/1990 |
| JP | 11-257700 A | 9/1999 |
| RU | 2267071 C2 | 12/2005 |
| RU | 2282807 C1 | 8/2006 |
| WO | 9606314 A | 2/1996 |
| WO | 2007032668 A | 3/2007 |

\* cited by examiner

*Primary Examiner* — Frantz Jules
*Assistant Examiner* — Henry Crenshaw
(74) *Attorney, Agent, or Firm* — Keith H. Orum

(57) ABSTRACT

The present invention relates to a measure for minimizing an undesired passage of fluid from a first sector (1) to a second sector (2) separated by a non-fluid-tight separation (3), wherein a first pressure (P1-1) prevails in the first sector (1) and a lower second pressure (P2-1) than the first pressure (P1-1) prevails in the second sector (2). An intermediate chamber (4) which separates the two sectors (1, 2) from one another is arranged at the separation (3).

A conveyor mechanism (5) is further provided which is designed to convey fluid from the intermediate chamber (4) to the first sector (1).

18 Claims, 3 Drawing Sheets

(prior-art)

DEVICE FOR MINIMIZING AN UNDESIRED PASSAGE OF FLUID FROM A FIRST SECTOR TO A SECOND SECTOR AS WELL AS A HEAT EXCHANGER SYSTEM COMPRISING SUCH A DEVICE

The present invention relates to a device for minimizing an undesired passage of fluid from a first sector to a second sector separated by a non-impermeable separation, wherein a first pressure prevails in the first sector and a second pressure which is lower than the first pressure prevails in the second sector. The invention moreover relates to a heat exchanger system in which the inventive device is used to minimize an unwanted passage of fluid from the sector of the heat exchanger system through which the warm fluid flows to the sector of the heat exchanger system through which the cold fluid flows.

The present invention presumes the provision of an enclosed room, its spatial shell not being completely gas or airtight, so that leakages can in principle occur. Such leakages are in particular to be expected at locations in the spatial shell in which components are inserted through the spatial shell.

The airtightness of a building and specifically the airtightness of a room enclosed within a shell is an important criterion as regards thermal insulation in terms of the question of how to reduce infiltration heat losses. The airtightness of an enclosed room is determined by means of a differential pressure test (blower door test). In the process, a constant positive and negative pressure of e.g. 50 Pa is generated and maintained by a ventilator built into a spatial shell (usually at the door or window). The ventilator has to force the amount of air escaping through spatial shell leakages back into the enclosed room to be measured. The so-called n50 value indicates how many times the interior volume of air in the enclosed room is exchanged per hour.

Leakages in the spatial shell lead to an undesired and uncontrolled exchange between the room's atmosphere and the external atmosphere. The exchange of air thereby occurring leads to a continuous adding of external air into the room's spatial atmosphere and a continuous discharging of internal air as exhaust air.

The (undesired) exchange of air attributable, to leakages in the spatial shell is that much greater the greater the difference is between the pressure prevailing inside the enclosed room and that outside of the room. This is the case, for example, in a clean room in which the infiltration of dust and dirt is prevented by having a positive pressure permanently prevail within the room compared to the external atmosphere. By so doing, particle contamination can be kept under certain values. Clean flows are needed for specific manufacturing processes, above all in semiconductor manufacturing, in order to avoid any disturbance which might interfere with the structure of the integrated circuits on an order of magnitude of fractions of a micrometer. In a room in which a positive pressure is set compared to the external atmosphere, the leakages occurring due to the leakages in the spatial shell ultimately result in the medium within the room's atmosphere escaping through the room's leakages and thus the positive pressure being reduced.

However, the passage of fluid to the external atmosphere occurring from the room's atmosphere due to leakages in the spatial shell also plays a role in the case of rooms having an atmosphere of reduced oxygen content compared to "normal" air, occasioned for example by the addition of an inert gas. This type of inerting level in which the room's spatial atmosphere has a reduced oxygen content compared to "normal" air is often used for preventive fire control purposes. By reducing the oxygen content in the enclosed room, the risk of a fire developing can be minimized. Since an unwanted passage of fluid from the spatial atmosphere rendered inert to the external atmosphere can occur through the leakages in the spatial shell, the impermeability to the spatial shell is an important criterion in preventive fire control in terms of how much inert gas must be supplied to the closed room per unit of time in order to continuously maintain the desired inertization necessary to provide effective protection against fire. The problem in this is that because of the leakage flows attributable to the permeability of the spatial shell in a room rendered inert, fresh air, and thus oxygen, is continuously supplied to the inerted room such that—given no further supply of inert gas—the oxygen content in the room's atmosphere increases and the desired fire control is no longer afforded.

This effect is particularly pronounced when a higher pressure prevails in the enclosed room compared to the external atmosphere.

Based on the problem as described, the invention addresses the task of specifying a device to minimize an undesired passage of fluid from a first sector to a second sector in a simple and yet effective manner, even when the two sectors are separated by a separation which is not gas-tight or fluid-tight and a first pressure prevails in the first sector and a second pressure which is lower than the first pressure prevails in the second sector.

To solve this task, the invention proposes a device comprising an intermediate chamber at and coinciding with the separation separating the first sector from the second sector as well as a conveyor mechanism, wherein the conveyor mechanism is designed to generate a negative pressure in the intermediate chamber compared to the first pressure prevailing in the first sector, wherein the pressure generated in the intermediate chamber is the same or higher than the second pressure prevailing in the second sector, and wherein the conveyor mechanism is designed to convey fluid from the intermediate chamber to the first sector.

The invention is based on the recognition that the leakage flow from the first sector to the second sector through the separation is particularly dependent upon the difference in pressure between the first sector and the second sector. What can be achieved by the provision of an intermediate chamber wholly coinciding with the separation in which the conveyor mechanism is utilized to set a negative pressure compared to the first pressure prevailing in the first sector which is higher than and preferably just as high as the second pressure prevailing in the second sector is reducing—and, ideally, even neutralizing—the pressure difference between the pressure set in the intermediate chamber and the pressure prevailing in the second sector compared to the pressure difference between the first pressure prevailing in the first sector and the second pressure prevailing in the second sector. The leakage flow through the separation is thus reduced or, in the ideal case, even terminated.

In accordance with the invention, the pressure set in the intermediate chamber, which is a lower pressure than the first pressure prevailing in the first sector, is generated by the conveyor mechanism conveying fluid from the intermediate chamber into the first sector. The conveyor mechanism can be a ventilator or a pump, for example. Compared to a system which does not comprise an intermediate chamber, a reduced volume of fluid flows into the second sector per unit of time with the inventive solution. Ideally; i.e. when the pressure set in the intermediate chamber is identical to the second pressure prevailing in the second sector, passage of fluid from the intermediate chamber and from the first sector into the second sector can be completely prevented. This approach is particularly advantageous for uses which need to prevent a leakage-based mixing of the fluid contained in the first sector with the fluid contained in the second sector.

One preferred embodiment of the inventive solution provides for the side walls of the intermediate chamber to be formed on the one side by the separation and, on the other, by an additional separation disposed at a distance therefrom toward the first sector. A partition plate would for example be conceivable as the additional separation. The wall of the spatial shell can be utilized for the separation separating the first sector from the second sector.

As indicated above, the separation (wall of the spatial shell) separating the first sector from the second sector is in particular a partition having leakages for example at certain areas through which structurally-contingent parts of a technical system can pass. It is by no means necessary for the additional separation, which forms a side wall of the inter-mediate chamber, to be a completely fluid-tight separation. Rather, it is actually even advantageous when the additional separation makes use of a partition having leakages through which fluid can enter the intermediate chamber (desired or undesired) from the first sector. This type of fluid passage from the first sector to the intermediate chamber can ensure that the conveyor mechanism, with which fluid is conveyed from the inter-mediate chamber to the first sector, will always be operating within its preferably ideal operational range.

In one preferred realization of the inventive device, the conveyor mechanism is fluidically connected to the intermediate chamber by means of a system of pipes, wherein this system of pipes is provided on the intake side of the conveyor mechanism. The pressure side of the conveyor mechanism is fluidically connected to the first sector by means of a further system of pipes.

One particularly preferred realization of the inventive device further comprises sensor means having a first pressure sensor and a second pressure sensor, wherein the first pressure sensor serves to detect the second pressure prevailing in the second sector and the second pressure sensor serves to detect the pressure generated in the intermediate chamber by means of the conveyor mechanism. It is moreover preferred to provide control means designed to control the conveyor mechanism as a function of the pressure values detected by the sensor means so as to regulate the flow rate and thus the volume of fluid discharged per unit of time from the intermediate chamber and returned to the first sector. Specifically, the control means is thereby designed to control the conveyor mechanism such that the difference between the measured value of the second pressure prevailing in the second sector and the measured value of the pressure generated in the intermediate chamber assumes a predefined or definable value. As noted above, this predefined or definable value is lower than the value of the first pressure prevailing in the first sector and higher than and (ideally) equal to the value of the second pressure prevailing in the second sector.

The flow rate of the conveyor mechanism is preferably regulated automatically by the control means. It is of course also conceivable for same to be effected by an external input, for example by the user of the device.

As indicated above, it is preferable for the additional separation, which forms a side wall of the intermediate chamber, to be designed so as to not be completely fluid-tight but rather to comprise leakages enabling a passage of fluid from the first sector into the intermediate chamber. In the case of a partition plate being used as the additional separation; i.e. a partition which only provides limited permeability due to its structure, it is preferable for an additional pressure release mechanism to be provided with which an open fluid connection between the intermediate chamber and the first sector can be established as needed so as to thereby enable a desired overflow of fluid from the first sector into the intermediate chamber.

The pressure release in this case could conceivably make use of a pressure-controlled valve, for example, which preferably opens automatically when the difference between the first pressure prevailing in the first sector and the pressure generated in the intermediate chamber exceeds a predefined or definable value. This thereby ensures that the lower pressure generated in the intermediate chamber by means of the conveyor mechanism compared to the first pressure prevailing in the first sector does not fall below a pre-defined value. It is hereby in particular ensured that there is a sufficiently high enough pressure in the intermediate chamber for the optimum operation of the conveyor mechanism. This is particularly necessary for a controllable and defined flow rate for the conveyor mechanism and thus for effective operation of the inventive device.

Instead of a pressure-controlled valve to ensure minimum permeability for the additional separation, other devices are of course also conceivable to provide pressure release. Preferred in particular, however, is a device which is configured to control the setting of the overflow volume of fluid from the first sector to the intermediate chamber per unit of time. As noted above, the overflow volume of fluid per unit of time should be adapted to the ideal operational range of the conveyor mechanism.

The following will reference the included drawings in describing the invention on the basis of embodiments in greater detail.

BRIEF DESCRIPTION OF THE DRAWINGS

FIG. 1 provides a schematic view of a preferred embodiment of the inventive device for minimizing an undesired passage of fluid from a first sector 1 to a second sector 2 separated by a non-fluid-tight separation 3. The separation 3 is for example a structural wall of a spatial shell serving as a partition. In the embodiment depicted in FIG. 1, the first sector 1 is configured as an enclosed room limited by a spatial shell, whereby the separation 3 represents a part of the spatial shell.

Figure 1:
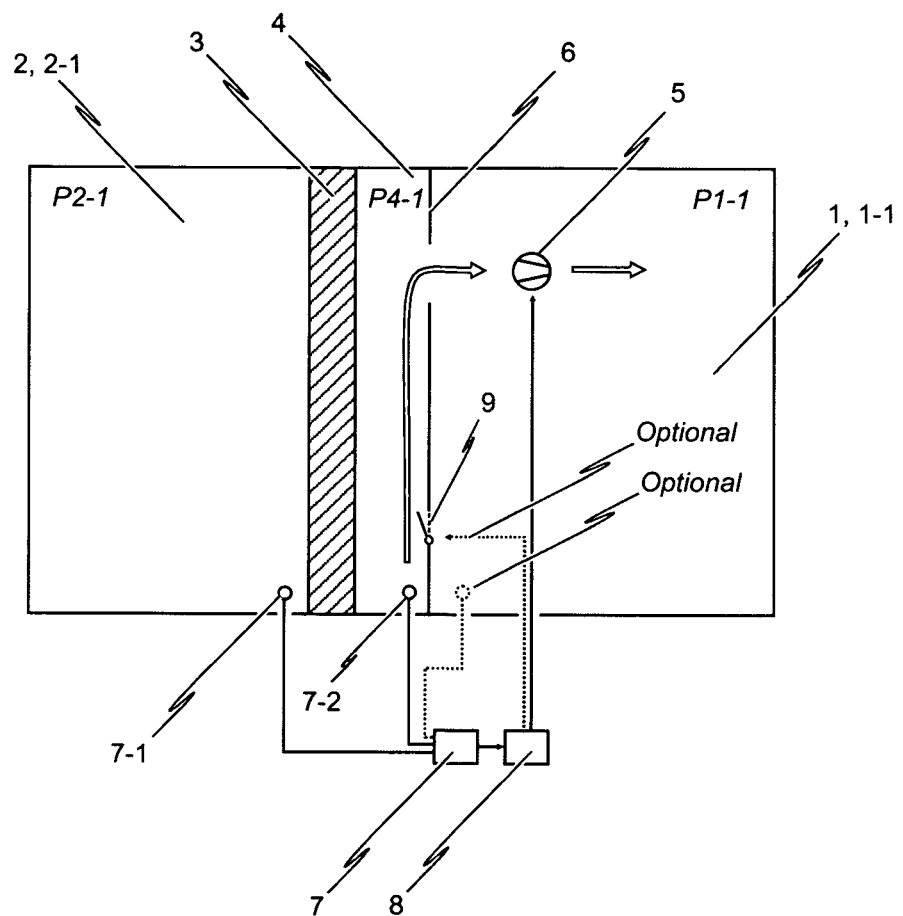
FIG. 1 a schematic view of an embodiment of the inventive device for minimizing an undesired passage of fluid from a first sector to a second sector separated by means of a non-impermeable separation.

The second sector 2, which can likewise be configured as a room enclosed by a spatial shell, directly adjoins the first sector 1, wherein the separation 3 concurrently also forms a wall of the spatial shell enclosing the second sector 2. Yet it is of course also conceivable for at least one of the two sectors 1, 2 to not be configured as a room enclosed by a spatial shell. Solely essential is that the two sectors 1, 2 are two adjoining areas which are separated from one another by a common partition (separation 3). Likewise essential is that the separation 3 is configured as a partition which is not completely fluid-tight. Instead, leakages are provided in the separation 3 (not explicitly shown in the representation according to FIG. 1) which form a fluid connection between the first sector 1 and the second sector 2.

Intentionally-provided openings are conceivable as the leakages in separation 3 as are, however, also unintentional leakages through which an undesired or uncontrolled exchange is possible between a first fluid 101 provided in the first sector 1 and a second fluid 102 provided in the second sector 2. Particularly applicable as the first and second fluids 101, 102 are gaseous or also liquid media having the same or also in fact different chemical compositions. For example, it is conceivable for the first fluid 101 contained within the first sector 1 to be gaseous nitrogen while the second fluid 102 contained in the second sector 2 can be normal air; i.e. a gaseous mixture with its principal components being nitrogen (78% by volume), oxygen (20.9% by volume), argon (0.9% by volume) and the rest being trace gases.

The device depicted schematically in the representation according to FIG. 1 was developed in order to minimize undesired passage of fluid from the first sector 1 to the second sector 2 when a first pressure P1-1 prevails in the first sector 1 and a second pressure P2-1, which is lower than the first pressure P1-1, prevails in the second sector 2. Without making a special provision—due to the pressure difference prevailing across the separation 3—a leakage flow would occur through the leakages of the separation 3, a consequence of which would be an (undesired) passage of fluid from the first sector 1 to the second sector 2. If no provision is made to compensate for the undesired passage of fluid, the leakage flow would lead to a decrease in the first pressure P1-1 originally set in the first sector 1 as well as to a mixing of the two fluids 101, 102 in the second sector 2.

In order to prevent this, the invention provides for an intermediate chamber 4 to be formed at the separation 3 which completely separates the two sectors 1, 2 from one another. As FIG. 1 shows, an additional separation 6, for example in the form of an additional partition or in the form of a partition plate, is employed in the embodiment of the inventive device depicted, wherein this additional separation 6 is set at a distance toward the first sector 1. A sufficient spacing between the separation 3 and the additional separation 6 would be a gap of e.g. 10 cm wide. As already noted above, it is not mandatory for the additional separation 6, which forms a side wall of the intermediate chamber 4, to be completely fluid-impermeable. Rather, it is actually desired to have a certain passage of fluid be possible between the first sector 1 and the intermediate chamber 4.

The inventive device in accordance with the embodiment depicted in FIG. 1 further comprises a conveyor mechanism 5, for example in the form of a ventilator or in the form of a pump. By means of a system of pipes (not explicitly shown in FIG. 1), the conveyor mechanism 5 connects on the one side to the intermediate chamber 4 and on the other to the first sector 1 so to be able to convey fluid 101 from the intermediate chamber 4 into the first sector 1.

The functioning of the inventive device is based on appropriately controlling the conveyor mechanism 5 such that a lower pressure is generated in the intermediate chamber 4 compared to the first pressure P1-1 prevailing in the first sector 1. Ideally, the flow rate of the conveyor mechanism 5 is regulated such that the pressure P4-1 generated in the intermediate chamber 4 is of the same magnitude as the second pressure P2-1 prevailing in the second sector 2. In this (ideal) case, the difference between the pressure P4-1 prevailing in the intermediate chamber 4 and the second pressure P1-1 prevailing in the second sector 2 amounts to zero such that leakage flow based on a pressure difference can no longer occur through the separation 3.

The invention is however not limited to the above-described ideal case in which the pressure P4-1 generated in the intermediate chamber 4 is exactly the same as the second pressure P2-1 prevailing in the second sector 2. Instead, it suffices when the pressure P4-1 generated in the intermediate chamber 4 assumes a value between the first pressure P1-1 prevailing in the first sector 1 and the second pressure P2-1 prevailing in the second sector 2. This is enough to reduce an undesired passage of fluid through the leakages of separation 3 since the pressure difference occurring across the separation 3, which serves as the driving force for the leakage flow through said separation 3, is reduced compared to sectors not provided with an intermediate chamber.

As FIG. 1 shows, the fluid 101 conveyed from the intermediate chamber 4 by the conveyor mechanism 5 is recirculated back into the first sector 1. Doing so thus ensures that no fluid 101 can escape from the first sector 1 and reach the second sector 2 through the separation 3. The inventive device can thus prevent or at least reduce an undesired passage of fluid, even when not only the separation 3 but also the additional separation 6 which forms a side wall of the intermediate chamber 4 is fluid-permeable.

Preferably, the device according to the invention is designed as an automatically-functioning system in which the flow rate of the conveyor mechanism 5 independently adjusts to the prevailing or arising pressure values.

One preferred embodiment of the inventive solution, which also enters into the example shown in the representation according to FIG. 1, provides for sensor means 7 comprising a first pressure sensor 7-1 and a second pressure sensor 7-2. The first pressure sensor 7-1 is arranged in the second sector 2 and serves to detect the second pressure P2-1 prevailing in said second sector 2. The second pressure sensor 7-2 is disposed in the intermediate chamber 4 and serves to detect the pressure P4-1 generated in same by the conveyor mechanism 5.

The pressure values measured by the two pressure sensors 7-1, 7-2, the sensor means 7 respectively, are fed to a control means 8 connected to the conveyor mechanism 5 in order to correspondingly set the flow rate of same as a function of the measured pressure values. Specifically, the control means 8 is designed to control the conveyor mechanism 5 such that the difference between the value measured for the second pressure P2-1 prevailing in the second sector 2 and the value measured for the pressure P4-1 generated in the intermediate chamber 4 by means of the conveyor mechanism 5 assumes a predefined or definable value which ideally is identical to the value of the second pressure P2-1 prevailing in the second sector 2, or is at least between the value of the second pressure P2-1 prevailing in the second sector 2 and the value of the first pressure P1-1 prevailing in the first sector 1.

In the schematic view according to FIG. 1, the dotted line represents that the sensor means 7 can optionally comprise a further third pressure sensor to detect the first pressure P1-1 prevailing in the first sector 1. This measured pressure value can be fed to the control means 8 in order to decide whether the pressure P4-1 generated in the intermediate chamber 4 has assumed the predefined or definable value.

As indicated above, the additional separation 6, which forms a side wall of the inter-mediate chamber 4, can comprise structurally-contingent and/or undesired leakages. Preferably, the additional separation 6 should be configured with respect to its impermeability such that the volume of fluid overflowing per unit of time from the first sector 1 to the intermediate chamber 4 assumes a value which ensures the optimum operation of the conveyor mechanism 5. In a case when the additional separation 6 is configured to be relatively fluid-tight, a pressure-release mechanism 9 can be utilized to set the volume of fluid overflowing from the first sector 1 to the intermediate chamber 4 per unit of time.

The mechanism 9 utilized to provide pressure release in the embodiment of the inventive solution depicted in FIG. 1 is a mechanically-functioning pressure release valve, via which the volume of fluid overflowing from the first sector 1 to the intermediate chamber 4 per unit of time is set automatically and in dependence on the pressure difference existing between the first pressure P1-1 prevailing in the first sector 1 and the pressure P4-1 generated in the intermediate chamber 4. Provided that the first pressure P1-1 prevailing in the first sector 1 can be regarded as being constant, the pressure-controlled valve 9 used in the embodiment of the inventive solution depicted in FIG. 1 is designed to automatically set the volume of fluid overflowing from the first sector 1 to the intermediate chamber 4 per unit of time as a function of the current value of the pressure P4-1 prevailing in the intermediate chamber 4.

Figure 2:
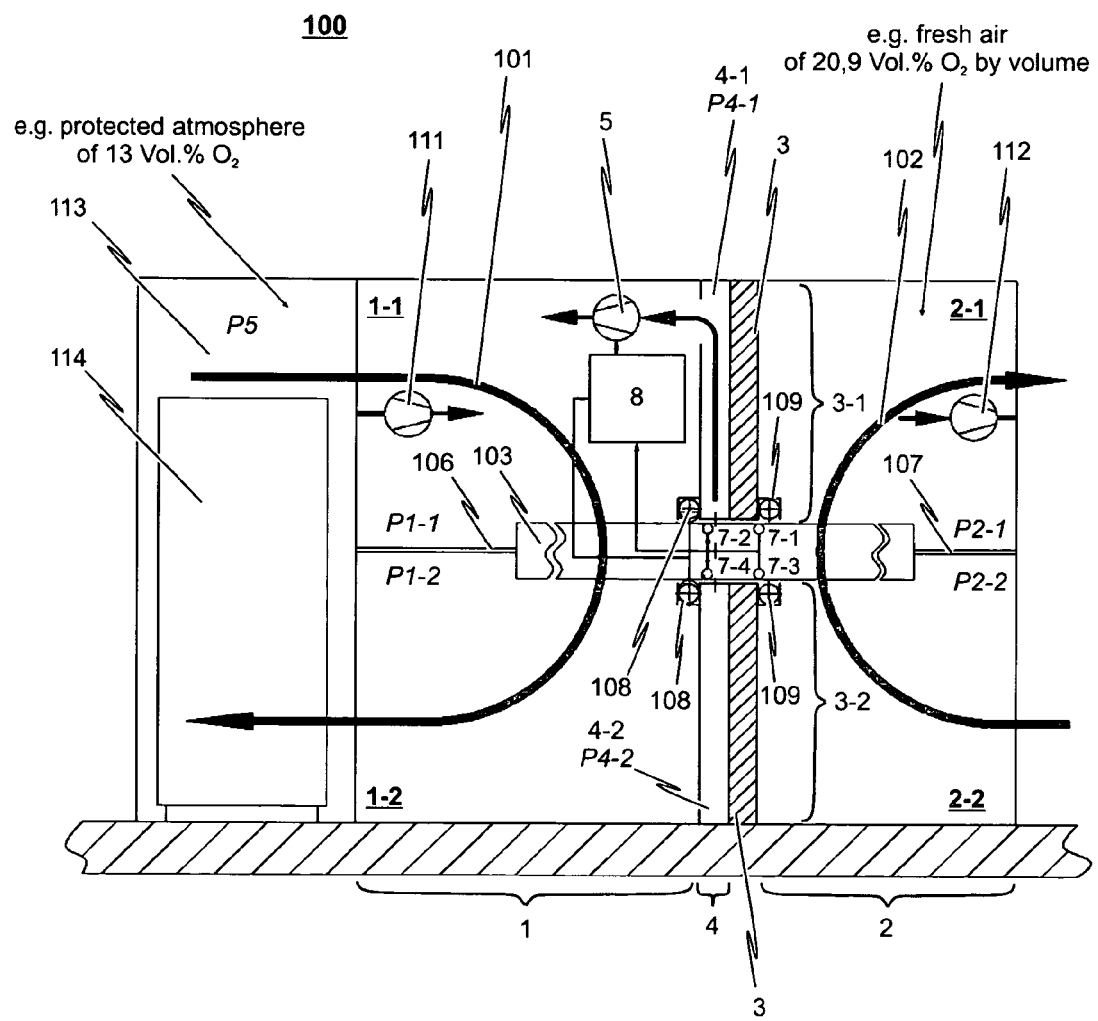
FIG. 2 a schematic view of a heat exchanger system for transferring thermal energy between a warm fluid and a cold fluid, wherein the heat exchanger system comprises an embodiment of the inventive device to minimize an undesired passage of fluid from a first sector through which the warm fluid flows to a second sector through which the cold fluid flows.

The following will reference FIG. 2 in describing a heat exchanger system 100 which makes use of the inventive device in order to minimize an undesired passage of fluid between the heat exchange media (first or warm fluid 101 and second or cold fluid 102). Irrespective of whether the separation provided between the heat exchange media 101, 102 (to be hereinafter referred to as "first separation 3") comprises leakages which enable a transfer of matter, the inventive device can achieve a minimizing of the fluid overflow.

The heat exchanger system 100 described in the following with reference to FIG. 2 is a system utilizing a thermal wheel or rotor 103 as the heat exchanger. This description of a heat exchanger designed as a regenerator is only given as an example. The use of the inventive device is in particular not limited to a heat exchanger system 100 which uses a regenerator to provide a semi-direct transfer of heat. Rather, the inventive solution can of course also be employed in a heat exchanger which uses a recuperator to provide an indirect transfer of heat.

Nor is the inventive solution limited solely to use in a heat exchanger system. As can be seen from the embodiment depicted in FIG. 1, the inventive solution is essentially suited to all systems having two sectors separated by a fluid-permeable separation, whereby a pressure prevails in the first sector which is higher than the pressure prevailing in the second sector.

It is pointed out that a heat exchanger system utilizing a rotor 103 to effect a semi-direct transfer of heat between a warm fluid 101 flowing in the first sector 1 and a cold fluid 102 flowing in the second sector 2 has been selected to illustrate the functioning of the inventive device. Since leakages between the rotor on the one hand and the separation 3 on the other always occur in such types of rotating heat exchangers due to their design, a heat exchanger system which makes use of the inventive solution is especially suited to demonstrate the advantages attainable with the inventive solution.

Before going into how the device according to the present invention used in a heat exchanger system works, however, the functioning of a conventional rotating heat exchanger 100 will first be described with reference being made to the representation provided in FIG. 3.

The heat exchanger system 100 depicted schematically in FIG. 3 and generally known from the prior art is configured as follows: the heat exchanger system 100 comprises a first flow sector (hereinafter called "first sector 1") through which flows a warm fluid 101. A second flow sector (hereinafter called "second sector 2") through which flows a cold fluid 102 is further provided.

For the warm fluid flow, it is for example conceivable to use the exhaust air from data processing equipment 114 disposed in a server room 113 adjacent to the first sector 1. Conceivable for cooling such data processing equipment 114 is using the heat exchanger system 100 to supply the (warm) exhaust air from the server room 113 to the heat exchanger system 100 via a first ventilator block 111. In the heat exchanger system 100, thermal energy from the warm fluid 101 is transferred through a heat exchanger 103 to the cold fluid flow 102 flowing through the second sector 2. After passing through the heat exchanger 103, the cooled fluid flow 101 is recirculated back to the server room 109.

The cold fluid flow 102 used as the cooling medium flows through the second sector 2 of the heat exchanger system 100, wherein a second ventilator block 112 is used to, for example, draw in outside air to cool the heat exchanger 103 and recirculate it back to the outside atmosphere in warmed form after it passes through the heat exchanger 103.

The first sector 1, through which the warm fluid 101 to be cooled flows in the heat exchanger system 100, and the second sector 2, through which the cold fluid 102 to be warmed flows, are spatially separated from one another by a first separation 3 configured as a partition. A rotor opening 105 is provided in this first separation 3 through which extends the rotor 103 utilized as a heat exchanger in the embodiment of the heat exchanger system 100 depicted in FIG. 3.

This rotor 103 is a rotatably-mounted thermal wheel, wherein the rotational axis runs through the rotor opening 105 formed in the first separation 3. The rotor 103 comprises numerous ducts parallel to the rotational axis. The transfer of heat utilizes the ability of the walls of these ducts to store thermal energy (heat). The warm exhaust air from the data processing equipment 114 (warm fluid 101) is blown through the ducts situated in the half of the rotor 103 positioned within the first sector 1. So doing heats the walls of the respective ducts.

When the rotating heat exchanger is operating, the rotor 103 continues to turn so that the warmed ducts reach the area in the second sector 2 through which flows the cold outside air (cold fluid 102). The warm walls of the ducts heat the cold fluid 102, which leads to a cooling of the walls.

Figure 3:
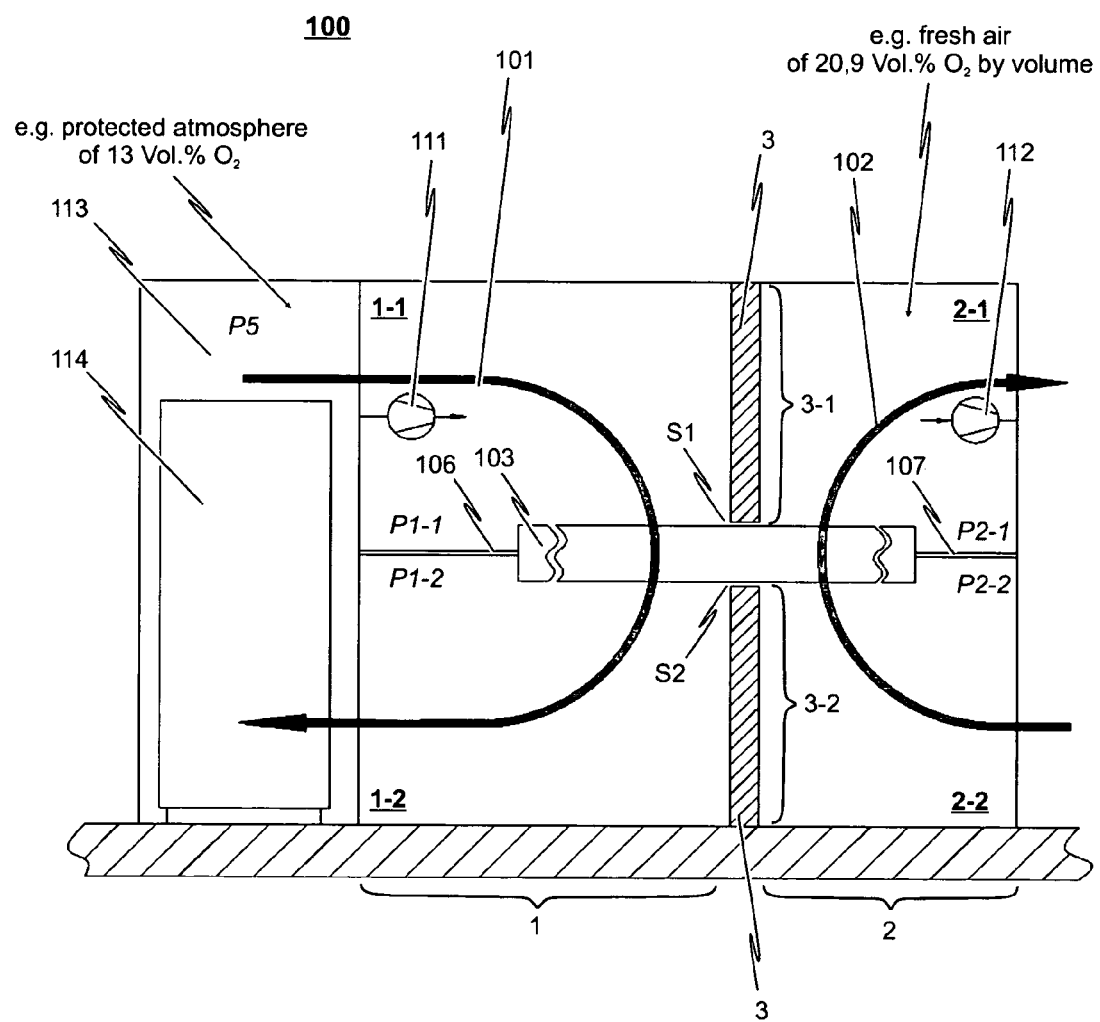
FIG. 3 the heat exchanger system depicted in FIG. 2 without the inventive device for minimizing an undesired passage of fluid from the first sector through which the warm fluid flows to the second sector through which the cold fluid flows.

Necessary for the operation of the heat exchanger system 100 according to FIG. 3 is for the flow of warm fluid 101 in the first sector 1 to be routed through the appropriate ducts of the rotor 103 actually situated right in the first sector 1. In like manner, it needs to be ensured that the flow of cold fluid 102 in the second sector is routed through the ducts of the rotor 103 actually situated right in the second sector 2.

To achieve this, the heat exchanger system 100 is furnished with a second and third separation 106, 107. The second separation 106 is arranged in the first sector 1 such that the first sector 1 is divided into a first warm fluid chamber 1-1 and a second warm fluid chamber 1-2. The first warm fluid chamber 1-1 is fluidically connected to the second warm fluid chamber 1-2 by means of the ducts of the rotor 103 situated in the first sector 1.

Conversely, the third separation 107 is arranged in the second sector 2 such that the second sector 2 is divided into a first cold fluid chamber 2-1 and a second cold fluid chamber 2-2, wherein these two cold fluid chambers 2-1, 2-2 are fluidically connected by means of the ducts of the rotor 103 situated in the second sector 2.

Particularly to be seen from the representation provided in FIG. 3 is that the second separation 106 and the third separation 107 are arranged such that they extend radially from the rotor 103 and perpendicular to the rotational axis of said rotor 103.

Since the rotatably-mounted rotor 103 which runs through the first and second sector 1, 2 upon rotation constitutes a flow resistance in both the first as well as the second sector 1, 2 through which the respective fluid flow has to pass in the heat exchanger system 100, a first pressure P1-1 is set in the first warm fluid chamber 1-1 and a third pressure P1-2 is set in the second warm fluid chamber 1-2 separated from the first warm fluid chamber 1-1 by the rotor 103 and the second separation 106, wherein the third pressure P1-2 is lower than the first pressure P1-1.

Since the heat exchanger system 100 operates according to the counterflow principle, a pressure (second pressure P2-1) prevails in the first cold fluid chamber 2-1 which is lower than the pressure (fourth pressure P2-2) prevailing in the second cold fluid chamber 2-2.

Accordingly, a pressure difference develops between the first warm fluid chamber 1-1 and the first cold fluid chamber 2-1, separated from one another by the first separation 3, whereby the first pressure P1-1 prevailing in the first warm fluid chamber 1-1 is higher than the second pressure P2-1 prevailing in the first cold fluid chamber 2-1. In like manner, a pressure difference also develops between the second warm fluid chamber 1-2 and the second cold fluid chamber 2-2. The fourth pressure P2-2 prevailing in the second cold fluid chamber 2-2 can be higher than the second pressure P1-2 prevailing in the second warm fluid chamber 1-2.

Since the first separation 3 does not constitute a fluid-tight partition with which the first sector 1 and the second sector 2 of the heat exchanger system are separated from one another so as to be impermeable to matter, the pressure difference arising between one warm fluid chamber 1-1, 1-2 and an adjacently-disposed cold fluid chamber 2-1, 2-2 effects a leakage flow, wherein the warm fluid 101 from the first warm fluid chamber 1-1 flows to the adjacent first cold fluid chamber 2-1 through the leakages and in particular through a first gap opening S1 provided on the hub of the rotor 103.

On the other hand, a counterflow hereto can occur in the lower section of the heat exchanger system 100 with which cold fluid 102 from the second cold fluid chamber 2-2 can flow to the second warm fluid chamber 1-2 through leakages in the first separation 3 and in particular through a second gap opening S2 provided on the hub of the rotor 103.

Thus, the operation of the heat exchanger system known from the prior art and depicted schematically in FIG. 3 cannot prevent an exchange of material from occurring between the first sector 1 and the second sector 2.

The solution according to the invention, as described above by means of an embodiment referencing the representation provided in FIG. 1, is suited for use in a heat exchanger system 100 as depicted in FIG. 3 as an example in order to effectively prevent the passage of fluid between the first sector 1 and the second sector 2 when the heat exchanger system 100 is in operation.

The embodiment of the heat exchanger system 100 depicted in FIG. 2, however, makes use of the inventive solution to prevent an undesired passage of fluid from the first sector 1 to the second sector 2 when the heat exchanger system 100 is in operation.

It is specifically provided hereby that the intermediate chamber 4 described above with reference to the embodiment according to FIG. 1 is provided in the first sector 1 (warm air zone of the heat exchanger system) directly adjacent the first separation 3 which separates the warm air zone of the heat exchanger system 1 from the fresh air zone (second sector 2).

A partition plate distanced 10 cm for example toward the first sector 1 and forming a side wall of the intermediate chamber 4 can for example be used for this purpose. The first barrier 3 thereby constitutes the corresponding opposite side wall of the intermediate chamber 4.

To enable a rotation of the rotor 103 about the rotational axis when the heat exchanger system 100 is in operation, the rotor opening 105 extends through both the first separation 3 as well as through the additional separation 6 (partition plate) constituting the side wall of the intermediate chamber 4 facing the first sector 1 in the embodiment of the heat exchanger system 100 depicted in FIG. 2. An upper gap opening (first gap S1) is still provided in the hub area of rotor 103 via which an open fluid connection is formed between the first warm fluid chamber 1-1 and the first cold fluid chamber 2-1, as is a lower gap opening (second gap S2) which constitutes an open fluid connection between the second warm fluid chamber 1-2 and the second cold fluid chamber 2-2.

Accordingly, there is still a partition (first separation 3) between the first sector 1 and the second sector 2 exhibiting leakages through which a material exchange is possible between the media (warm fluid 101, cold fluid 102) respectively flowing in first sector 1 and in second sector 2.

As is the case with the embodiment of the inventive solution described with reference to the FIG. 1 representation, the heat exchanger system 2 depicted schematically in FIG. 2 provides for a conveyor mechanism 5, the intake side of which is connected to the intermediate chamber 4 by means of a system of pipes (not explicitly shown in FIG. 2). The conveyor mechanism 5 serves to convey fluid from the intermediate chamber 4 into the first sector 1. Although the outlet of the conveyor mechanism 5 opens out into the first warm fluid chamber 1-1 in FIG. 2, it is of course also conceivable for fluid discharged from the intermediate chamber 4 to be routed to the second warm fluid chamber 1-2.

In detail, the embodiment depicted in FIG. 2 provides for the rotor opening 105 to divide the intermediate chamber 4 into an upper first section 4-1 and a lower second section 4-2. The upper first section 4-1 of the intermediate chamber 4 extends over a first section 3-1 of the first separation 3, and specifically over the area of the first separation 3 separating the first warm fluid chamber 1-1 from the first cold fluid chamber 2-1. The lower second section 4-2 of the intermediate chamber 4 extends over a second section 3-2 of the first separation 3, and specifically over the area of the first separation 3 separating the second warm fluid chamber 1-2 from the second cold fluid chamber 2-2. The second section 4-2 of the intermediate chamber 4 is fluidically connected to the first section 4-1 of the intermediate chamber 4 via the corresponding ducts of the rotor 103.

In order for the inventive solution to achieve no overflow of fluid occurring between the first sector (first and second warm fluid chamber 1-1, 1-2) and the second sector 2 (first and second cold fluid chamber 2-1, 2-2) in the heat exchanger system 100 according to FIG. 2 or 3 despite the unavoidable upper and lower gap openings S1, S2 in the hub area of the rotor 103 during operation of the heat exchanger system 100, the conveyor mechanism 5 is preferably controlled by an applicable control means 8 and the flow rate of the conveyor mechanism 5 regulated such that a lower pressure is generated in the first section 4-1 of the intermediate chamber 4 compared to the first pressure P1-1 prevailing in the first warm fluid chamber 1-1.

Specifically, a passage of fluid from the first warm fluid chamber 1-1 to the adjacent first cold fluid chamber 2-1 can be completely prevented when the pressure P4-1 set in the first section 4-1 of the intermediate chamber 4 by means of the conveyor mechanism 5 assumes a value which is identical to the value of the second pressure P2-1 prevailing in the first cold fluid chamber 2-1. There is then namely no pressure difference between the first section 4-1 of the intermediate chamber 4 and the first cold fluid chamber 2-1 able to effectively act as a driving force for a leakage flow of the warm fluid 101 through e.g. the first gap opening 51.

Of course compared to a heat exchanger system 100 in which no provisions have been made to minimize the passage of fluid, the overflowing volume of fluid from the first warm air chamber 1-1 to the first cold air chamber 2-1 per unit of time can be reduced when a pressure P4-1 is generated in the first section 4-1 of the intermediate chamber 4 which is lower than the first pressure P1-1 prevailing in the first warm fluid chamber 1-1 and higher than the second pressure P2-1 prevailing in the first cold fluid chamber 2-1.

On the other hand, it is also possible with the inventive solution to effectively prevent or at least reduce a passage of fluid between the second warm fluid chamber 1-2 and the second cold fluid chamber 2-2 even though an open fluid connection exists between the two fluid chambers 1-2 and 2-2 through the second gap opening S2 at the hub area of the rotor 103. Because the second section 4-2 of the intermediate chamber 4 is fluidically connected to the first section 4-1 of the intermediate chamber 4 by means of the ducts of the rotor 103, when the conveyor mechanism 5 is activated, some of the fluid situated in the second section 4-2 of the intermediate chamber 4 is also conveyed to the first sector (first warm fluid chamber 1-1 or second warm fluid chamber 1-2). A pressure P4-2 can thereby also be set in the second sector 4-2 of the intermediate chamber 4 by means of the conveyor mechanism 5 which is lower than the third pressure P1-2 prevailing in the second warm fluid chamber 1-2.

Provided that a third pressure P1-2 prevails in the second warm fluid chamber 1-2 and a fourth pressure P2-2 prevails in the second cold fluid chamber 2-2 which is lower than the third pressure P1-2, the passage of fluid between the second warm fluid chamber 1-2 and the second cold fluid chamber 2-2 can be effectively reduced when the pressure P4-2 generated in the second section 4-2 of the intermediate chamber 4 is exactly as high or higher than the fourth pressure P2-2 and lower than the third pressure P1-2.

As is the case with the embodiment depicted in FIG. 1, the control means 8 effects an automatic activation of the conveyor mechanism 5 in the example shown in FIG. 2 in order to effect the flow rate of the conveyor mechanism 5 as a function of the second pressure P2-1 prevailing in the first cold fluid chamber 2-1, the pressure P4-1 generated in the first section 4-1 of the intermediate chamber 4, the fourth pressure P2-2 prevailing in the second cold fluid chamber 2-2 and the pressure P4-2 generated in the second section 4-2 of the intermediate chamber 4.

To this end, a sensor means 7 is provided which comprises a first pressure sensor 7-1 to detect the second pressure P2-1 prevailing in the first cold fluid chamber 2-1, a second pressure sensor 7-2 to detect the pressure P4-1 set in the first section 4-1 of the inter-mediate chamber 4, a third pressure sensor 7-3 to detect the fourth pressure P2-2 prevailing in the second cold fluid chamber 2-2, and a fourth pressure sensor 7-4 to detect the pressure P4-2 prevailing in the second section 4-2 of the intermediate chamber 4.

The respective pressure sensors 7-1 to 7-4 of sensor means 7 are designed to detect the respective pressure values either continuously or at predetermined times or upon pre-determined events and feed same to the control means 8 which sets the flow rate of the conveyor mechanism 5 correspondingly.

Since the first gap opening S1 represents (among other things) an open fluid connection to the first section 4-1 of the intermediate chamber 4, fluid from the first warm fluid chamber 1-1 flows through this open fluid connection to the first section 4-1 of the intermediate chamber 4 when the conveyor mechanism 5 effects the generating of a lower pressure in the first section 4-1 of the intermediate chamber 4 compared to the first pressure P1-1 prevailing in the first warm fluid chamber 1-1.

In order to be able to appropriately set the pressure P4-1 generated in the first section 4-1 of the intermediate chamber 4 by regulating the flow rate of the conveyor mechanism 5 so as to effectively prevent or at least reduce a passage of fluid from the first warm fluid chamber 1-1 to the first cold fluid chamber 2-1, it is necessary to vary the open fluid connection formed by the first gap opening S1 as needed. The same also applies to the open fluid connection formed between the second warm fluid chamber 1-2 and the second section 4-2 of intermediate chamber 4 by the second gap opening S2.

To this end, a first flow brake 108 is provided in the first sector 1 of the embodiment of the heat exchanger system 100 depicted in FIG. 2 which is designed to limit an overflow of fluid from the first warm fluid chamber 1-1 to the first section 4-1 of the intermediate chamber 4 through the first gap S1 as well as an overflow of fluid from the second section 4-2 of the intermediate chamber 4 to the second warm fluid chamber 1-2 through the second gap S2. In detail, the first flow brake 108 can comprise a sealing element in the form of a flexible, inflatable tube which can be accommodated in a U-profile disposed on the additional separation 6. This inflatable tube runs above and beneath the rotor 103. In order to be able to set the volume of fluid overflowing per unit of time from the first warm fluid chamber 1-1 to the first section 4-1 of the intermediate chamber 4 through the first gap S1 and the volume of fluid overflowing per unit of time from the second section 4-2 of the intermediate chamber 4 to the second warm fluid chamber 1-2 through the second gap S2 to a predefined or definable value, the tube is inflated to a regulated diameter and thereby creates a narrowed yet non-contact gap 51, S2 to the rotor 103.

In principle, it is conceivable for the first flow brake 108 to be designed so as to set the overflowing volume of fluid per unit of time as a function of the flow rate of the conveyor mechanism 5. In principle, a least some of the fluid discharged from the intermediate chamber 4 by means of the conveyor mechanism 5 can be fed to the flexible inflatable tube of the first flow brake 108 in order to effect inflating of the tube to a regulated diameter.

A second flow brake 109 is further provided in the second sector 2 to limit the overflow of fluid from the first section 4-1 of the intermediate chamber 4 to the first cold fluid chamber 2-1 through the first gap S1 as well as an overflow of fluid from the second cold air chamber 2-2 to the second section 4-2 of the intermediate chamber 4 through the second gap S2 when the pressure P4-1 set in the first section 4-1 of the intermediate chamber 4 differs from the second pressure P2-1 prevailing in the first cold fluid chamber 2-1 and the pressure P4-2 set in the second section 4-2 of the intermediate chamber 4 differs from the fourth pressure P2-2 prevailing in the second cold fluid chamber 2-2.

The second flow brake 109 can be configured in the same manner as the first flow brake 108, as a sealing element in the form of a flexible inflatable tube.

To be established in summary is that the solution according to the invention is suited to effectively prevent a material mixing of the first fluid 101 flowing in the warm zone with the second fluid 102 flowing in the cold zone in a heat exchanger system 100 which does not have complete impermeability between the section in which flows the warm fluid flow and the section in which flows the cold fluid. It is thus conceivable to also make use of such heat exchanger systems, for example comprising a regenerator as the heat exchanger, in applications in which the atmosphere of a room rendered permanently inert is to be cooled by semi-direct heat transfer.

The solution according to the invention is particularly suited to the cooling of a server room 113 rendered continuously inert in which data processing equipment 114 is to be permanently operated in an oxygen-reduced atmosphere so as to counter the risk of fire. With these types of rooms rendered continuously inert, it is essential in terms of the operating costs for as little inert gas as possible to be added to the room's atmosphere to maintain a set inerting level over a longer period of time.

In the past, this condition has resulted in a conventional heat exchanger system 100, as described above with reference to the representation provided in FIG. 3, not being of economical use for cooling the spatial atmosphere of a room rendered continuously inert. The solution according to the invention enables a simple yet effective way of completely preventing or at least reducing a passage of fluid between the respective zones of the heat exchanger system such that when the heat exchanger system is in operation, a substantially lower volume of the spatial atmosphere of the permanently-inertized room can flow to the cold air side of the heat exchanger system and thus also only a lesser volume of inert gas needs to be added.

The invention claimed is:

1. A heat exchanger system for transferring thermal energy between a warm fluid and a cold fluid, wherein the heat exchanger system comprises the following:
a first sector through which flows the warm fluid and a second sector through which flows the cold fluid;
a first separation which spatially separates the first sector and the second sector from one another, wherein a first pressure prevails in the first sector and a second pressure which is lower than the first pressure prevails in the second sector;
a heat exchanger in the form of a regenerator to transfer thermal energy from the warm fluid flow to the cold fluid flow; and
at least one device to minimize an undesired passage of the warm fluid from the first sector to the second sector through the first separation, wherein the device comprises an intermediate chamber which is provided in the first sector directly adjacent the first separation which separates the first sector and the second sector from one another,
wherein side walls of the intermediate chamber are formed on one side by the first separation and, on another side, by an additional separation formed at a distance from the first separation toward the first sector; and
wherein the device further comprises a
conveyor mechanism, having an intake side which is connected to the intermediate chamber and a pressure side which is connected to the first sector, said conveyor mechanism being designed to convey fluid from the intermediate chamber to the first sector in order to generate a lower pressure in the intermediate chamber than the first pressure prevailing in the first sector, wherein the pressure generated in the intermediate chamber is substantially equal to the second pressure prevailing in the second sector;
wherein the heat exchanger system further comprises a rotatably-mounted rotor which comprises ducts parallel to the rotational axis and rotor openings extending through the first separation and the additional separation such that it extends through the first and second sector upon rotation, and wherein the following is further provided:
a second separation arranged in the first sector such that the first sector is divided into a first warm fluid chamber and a second warm fluid chamber which is fluidically connected to the ducts of the rotor situated in the first sector;
a third separation arranged in the second sector such that the second sector is divided into a first cold fluid chamber and a second cold fluid chamber which is fluidically connected to the ducts of the rotor situated in the second sector,
wherein a first pressure prevails in the first warm fluid chamber and a lower second pressure compared to the first pressure prevails in the first cold fluid chamber, and wherein a third pressure prevails in the second warm fluid chamber and a higher fourth pressure compared to the third pressure prevails in the second cold fluid chamber;
wherein the intermediate chamber comprises a first section extending over a first section of the first separation and a second section extending over a second section of the first separation and is fluidically connected to the first section of the intermediate chamber,
wherein the conveyer mechanism is designed to generate a lower pressure in the first section of the intermediate chamber compared to the first pressure and to generate a higher pressure in the second section of the intermediate chamber compared to the third pressure, wherein the pressure generated in the first section of the intermediate chamber is just as high or higher than the second pressure, and wherein the pressure generated in the second section of the intermediate chamber is just as high or higher than the fourth pressure;
wherein a passage of fluid from one of the sectors to the other of the sectors through the first separation is minimized by the difference in pressure occurring across the first separation between a cold fluid chamber and the associated adjacent warm fluid chamber being minimized.

2. A heat exchanger system according to claim 1, wherein the first section of the intermediate chamber is fluidically connected to the second section of the intermediate chamber by means of the ducts of the rotor situated in the first sector.

3. A heat exchanger system according to claim 1, which further comprises the following:
a sensor means having a first pressure sensor to detect the second pressure prevailing in the first cold fluid chamber, a second pressure sensor to detect the pressure set in the first section of the intermediate chamber, a third pressure sensor to detect a fourth pressure prevailing in the second cold fluid chamber, and a fourth pressure sensor to detect the pressure prevailing in the second section of the intermediate chamber; and
a control means to control a flow rate of the conveyor mechanism, wherein the control means is designed to automatically control the conveyor mechanism such that the difference between the measured value of the second pressure and the measured value of the pressure generated in the first section of the intermediate chamber assumes a predefined or definable value, and that the difference between the measured value of the fourth pressure and the measured value of the pressure generated in the second section of the intermediate chamber assumes a predefined or definable value.

4. A heat exchanger system according to claim 1, wherein a first flow brake is further provided in the first sector which is designed to limit an overflow of fluid from the first warm fluid chamber to the first section of the intermediate chamber through a first gap at the rotor opening between the rotor and the additional separation as well as an overflow of fluid from the second section of the intermediate chamber to the second warm fluid chamber through a second gap at the rotor opening between the rotor and the additional separation.

5. A heat exchanger system according to claim 4, wherein the first flow brake can be controlled such that the overflowing volume of fluid per unit of time from the first warm fluid chamber to the first section of the intermediate chamber through the first gap and the overflowing volume of fluid per unit of time from the second section of the intermediate chamber to the warm fluid chamber through the second gap can be set to a predefined or definable value.

6. A heat exchanger system according to claim 5, wherein the first flow brake is designed to set the overflowing volume of fluid per unit of time as a function of a flow rate of the conveyor mechanism.

7. A heat exchanger system according to claim 1, wherein a second flow brake is provided in the second sector to limit an overflow of fluid from the first section of the intermediate chamber to the first cold fluid chamber through the first gap at the rotor opening between the rotor and the first separation as well as an overflow of fluid from the section cold air chamber to the second section of the inter-mediate chamber through the second gap at the rotor opening between the rotor and the first separation.

8. A heat exchanger system according to claim 4, wherein the flow brakes comprise a sealing element in the form of a flexible, inflatable tube arranged on the additional separation at the two gaps between the additional separation and the rotor.

9. A heat exchanger system according to claim 2, which further comprises the following:
- a sensor means having a first pressure sensor to detect the second pressure prevailing in the first cold fluid chamber, a second pressure sensor to detect the pressure set in the first section of the intermediate chamber, a third pressure sensor to detect a fourth pressure prevailing in the second cold fluid chamber, and a fourth pressure sensor to detect the pressure prevailing in the second section of the intermediate chamber; and
- a control means to control the flow rate of the conveyor mechanism, wherein the control means is designed to automatically control the conveyor mechanism such that the difference between the measured value of the second pressure and the measured value of the pressure generated in the first section of the intermediate chamber assumes a predefined or definable value, and that the difference between the measured value of the fourth pressure and the measured value of the pressure generated in the second section of the intermediate chamber assumes a predefined or definable value.

10. A heat exchanger system according to claim 3, wherein a first flow brake is further provided in the first sector which is designed to limit an overflow of fluid from the first warm fluid chamber to the first section of the intermediate chamber through a first gap at the rotor opening between the rotor and the additional separation as well as an overflow of fluid from the second section of the intermediate chamber to the second warm fluid chamber through a second gap at the rotor opening between the rotor and the additional separation.

11. A heat exchanger system according to claim 9, wherein a first flow brake is further provided in the first sector which is designed to limit an overflow of fluid from the first warm fluid chamber to the first section of the intermediate chamber through a first gap at the rotor opening between the rotor and the additional separation as well as an overflow of fluid from the second section of the intermediate chamber to the second warm fluid chamber through a second gap at the rotor opening between the rotor and the additional separation.

12. A heat exchanger system according to claim 2, wherein a first flow brake is further provided in the first sector which is designed to limit an overflow of fluid from the first warm fluid chamber to the first section of the intermediate chamber through a first gap at the rotor opening between the rotor and the additional separation as well as an overflow of fluid from the second section of the intermediate chamber to the second warm fluid chamber through a second gap at the rotor opening between the rotor and the additional separation.

13. A heat exchanger system according to claim 10, wherein the first flow brake can be controlled such that the overflowing volume of fluid per unit of time from the first warm fluid chamber to the first section of the intermediate chamber through the first gap and the overflowing volume of fluid per unit of time from the second section of the intermediate chamber to the warm fluid chamber through the second gap can be set to a predefined or definable value.

14. A heat exchanger system according to claim 11, wherein the first flow brake can be controlled such that the overflowing volume of fluid per unit of time from the first warm fluid chamber to the first section of the intermediate chamber through the first gap and the overflowing volume of fluid per unit of time from the second section of the intermediate chamber to the warm fluid chamber through the second gap can be set to a predefined or definable value.

15. A heat exchanger system according to claim 12, wherein the first flow brake can be controlled such that the overflowing volume of fluid per unit of time from the first warm fluid chamber to the first section of the intermediate chamber through the first gap and the overflowing volume of fluid per unit of time from the second section of the intermediate chamber to the warm fluid chamber through the second gap can be set to a predefined or definable value.

16. A heat exchanger system according to claim 13, wherein the first flow brake is designed to set the overflowing volume of fluid per unit of time as a function of the flow rate of the conveyor mechanism.

17. A heat exchanger system according to claim 14, wherein the first flow brake is designed to set the overflowing volume of fluid per unit of time as a function of the flow rate of the conveyor mechanism.

18. A heat exchanger system according to claim 15, wherein the first flow brake is designed to set the overflowing volume of fluid per unit of time as a function of the flow rate of the conveyor mechanism.

* * * * *